(12) United States Patent
Lee

(10) Patent No.: US 10,013,180 B1
(45) Date of Patent: Jul. 3, 2018

(54) OPERATING METHODS OF NONVOLATILE MEMORY DEVICE AND DATA STORAGE DEVICE INCLUDING THE SAME

(71) Applicant: SK hynix Inc., Gyeonggi-do (KR)

(72) Inventor: Dong Sop Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/482,051

(22) Filed: Apr. 7, 2017

(30) Foreign Application Priority Data

Dec. 29, 2016 (KR) ........................ 10-2016-0182678

(51) Int. Cl.
| | | |
|---|---|---|
| *G11C 7/00* | (2006.01) | |
| *G06F 3/06* | (2006.01) | |
| *G11C 7/22* | (2006.01) | |
| *G11C 7/10* | (2006.01) | |
| *G11C 8/06* | (2006.01) | |
| *G11C 8/10* | (2006.01) | |

(52) U.S. Cl.
CPC ............ *G06F 3/061* (2013.01); *G06F 3/0638* (2013.01); *G06F 3/0656* (2013.01); *G06F 3/0659* (2013.01); *G06F 3/0679* (2013.01); *G11C 7/10* (2013.01); *G11C 7/22* (2013.01); *G11C 8/06* (2013.01); *G11C 8/10* (2013.01)

(58) Field of Classification Search
CPC .... G11C 7/10; G11C 7/22; G11C 8/06; G11C 8/10; G06F 3/061; G06F 3/0638; G06F 3/0659; G06F 3/0679
See application file for complete search history.

(56) References Cited

U.S. PATENT DOCUMENTS

| | | | | |
|---|---|---|---|---|
| 8,255,643 | B2* | 8/2012 | Mun .................... | G06F 11/1072 711/103 |
| 8,990,481 | B2* | 3/2015 | Yoon ................... | G06F 12/0246 365/185.33 |
| 8,996,792 | B2* | 3/2015 | Mun ...................... | G11C 16/10 711/103 |

FOREIGN PATENT DOCUMENTS

| KR | 1020110055178 | 5/2011 |
|---|---|---|
| KR | 101563647 | 10/2015 |

* cited by examiner

*Primary Examiner* — Pho M Luu
(74) *Attorney, Agent, or Firm* — IP & T Group LLP

(57) ABSTRACT

A method for operating a data storage device including a nonvolatile memory device and a controller which controls the nonvolatile memory device includes the controller transmitting to the nonvolatile memory device one of a command, an address, seed data and data via a input/output line and first, second and third control signals via corresponding signal lines; and the nonvolatile memory device receiving any one of the transmitted command, the address, the seed data and the data depending on at least two of the first, second and third control signals.

18 Claims, 8 Drawing Sheets

| CLE | ALE | DS | IO |
|-----|-----|-----|-----|
| H | L | Don't Care | CMD |
| L | H | Don't Care | ADD |
| H | H | Toggle | SD |
| L | L | Toggle | DT |

OPERATING METHODS OF NONVOLATILE MEMORY DEVICE AND DATA STORAGE DEVICE INCLUDING THE SAME

CROSS-REFERENCES TO RELATED APPLICATION

The present application claims priority under 35 U.S.C. § 119(a) to Korean application number 10-2016-0182678, filed on Dec. 29, 2016, in the Korean Intellectual Property Office, which is incorporated herein by reference in its entirety.

BACKGROUND

1. Technical Field

Various embodiments relate to an operating method of a nonvolatile memory device, which randomizes data based on seed data provided from a controller, and an operating method of a data storage device including the nonvolatile memory device.

2. Related Art

Recently, the paradigm for the computer environment has been converted into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to an operating method of a nonvolatile memory device, which randomizes data based on seed data provided from a controller, and an operating method of a data storage device including the nonvolatile memory device.

In an embodiment, a method for operating a data storage device including a nonvolatile memory device and a controller which controls the nonvolatile memory device may include: the controller transmitting to the nonvolatile memory device one of a command, an address, seed data and data via a input/output line and first, second and third control signals via corresponding signal lines; and the nonvolatile memory device receiving any one of the transmitted command, the address, the seed data and the data depending on at least two of the first, second and third control signals.

In an embodiment, a method for operating a nonvolatile memory device may include: receiving input/output signals including a command, an address, seed data and data through input/output lines; and receiving a first control signal and a second control signal; and identifying the input/output signal as the seed data when the first control signal and the second control signal are enabled.

In an embodiment, a nonvolatile memory device may include: an input/output buffer block suitable for receiving input/output signals including one or more of a command, an address, data and seed data based on a combination of first to third control signals; a seed storage block suitable for storing the seed data; a randomization/de-randomization block suitable for randomizing the data to be stored in memory cells or de-randomizing data read out from the memory cells based on the seed data, and wherein the input/output buffer block provides the seed data to the seed storage block when the first and second control signals are enabled.

According to the embodiments, seed data to be used in a data randomizing operation of a nonvolatile memory device may be provided efficiently between a controller and the nonvolatile memory device.

DETAILED DESCRIPTION

Figure 1:
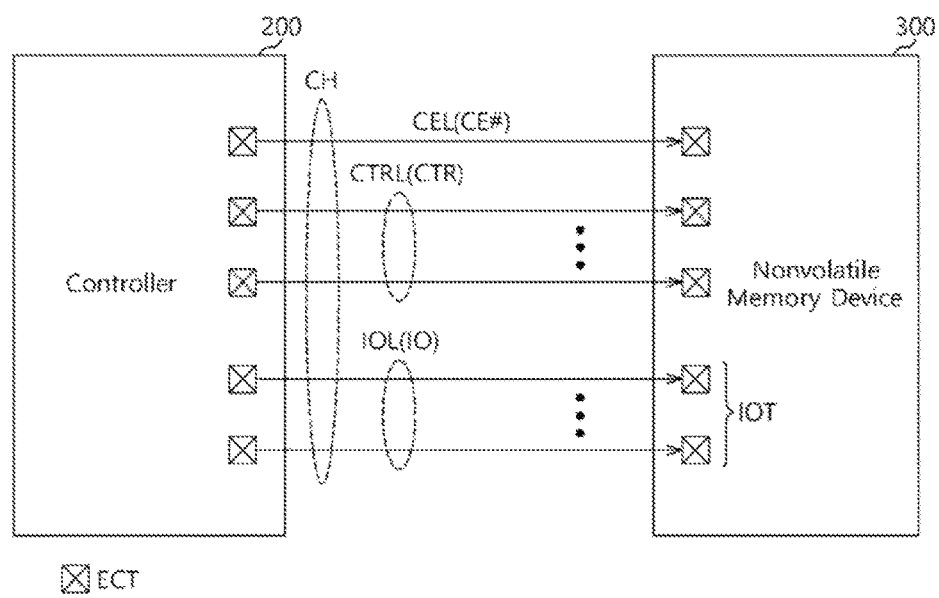
FIG. 1 is a diagram illustrating a nonvolatile memory device and a controller included in a data storage device.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes," "comprises," "comprising" and/or "including," when used in this specification, specify the presence of at least one stated feature, step, operation, and/or element, but do not preclude the presence or addition of one or more other features, steps, operations, and/or elements thereof.

Hereinafter, operating methods of a nonvolatile memory device and a data storage device including the same will be described below with reference to the accompanying drawings through various examples of embodiments.

FIG. 1 is a diagram illustrating a nonvolatile memory device 300 and a controller 200 included in a data storage device. For the sake of convenience in explanation, the controller 200 and the nonvolatile memory device 300 which transmit and receive a chip enable signal CE#, control signals CTR and input/output signals IO are illustrated in FIG. 1.

Each of the controller 200 and the nonvolatile memory device 300 may include external connection terminals ECT. The external connection terminals ECT may include structural bodies such as pads, leads, pins and balls for transmitting and receiving signals to and from an external device.

The controller 200 and the nonvolatile memory device 300 may be connected with each other through signal lines through the external connection terminals ECT. The controller 200 and the nonvolatile memory device 300 may transmit and receive various signals, for example, control signals and data, through the signal lines. One or more signal lines may form a channel CH.

For example, referring to FIG. 1, the controller 200 may transmit the chip enable signal CE# through a chip enable signal line CEL to the nonvolatile memory device 300. The controller 200 may transmit the control signals CTR through control signal lines CTRL to the nonvolatile memory device 300. Further, the controller 200 may transmit the input/output signals IO to the nonvolatile memory device 300 or receive the input/output signals IO from the nonvolatile memory device 300 through input/output lines IOL.

The nonvolatile memory device 300 may operate according to an input/output multiplexing scheme. That is to say, the nonvolatile memory device 300 may be controlled by the controller 200 according to the input/output multiplexing scheme. According to the input/output multiplexing scheme, the controller 200 may transmit all of a command, an address and data as the input/output signals IO through the input/output lines IOL. Since all of the command, the address and data are transmitted through the input/output lines IOL, the input/output lines IOL may be referred to as a shared input/output lines IOL.

In order to notify the nonvolatile memory device 300 which one among the command, the address and data is provided through the input/output lines IOL as the input/output signal IO, the controller 200 may transmit at least one control signal. The nonvolatile memory device 300 may recognize what kind of the input/output signal IO is provided according to the control signal or a combination of control signals provided from the controller 200.

Figure 2:
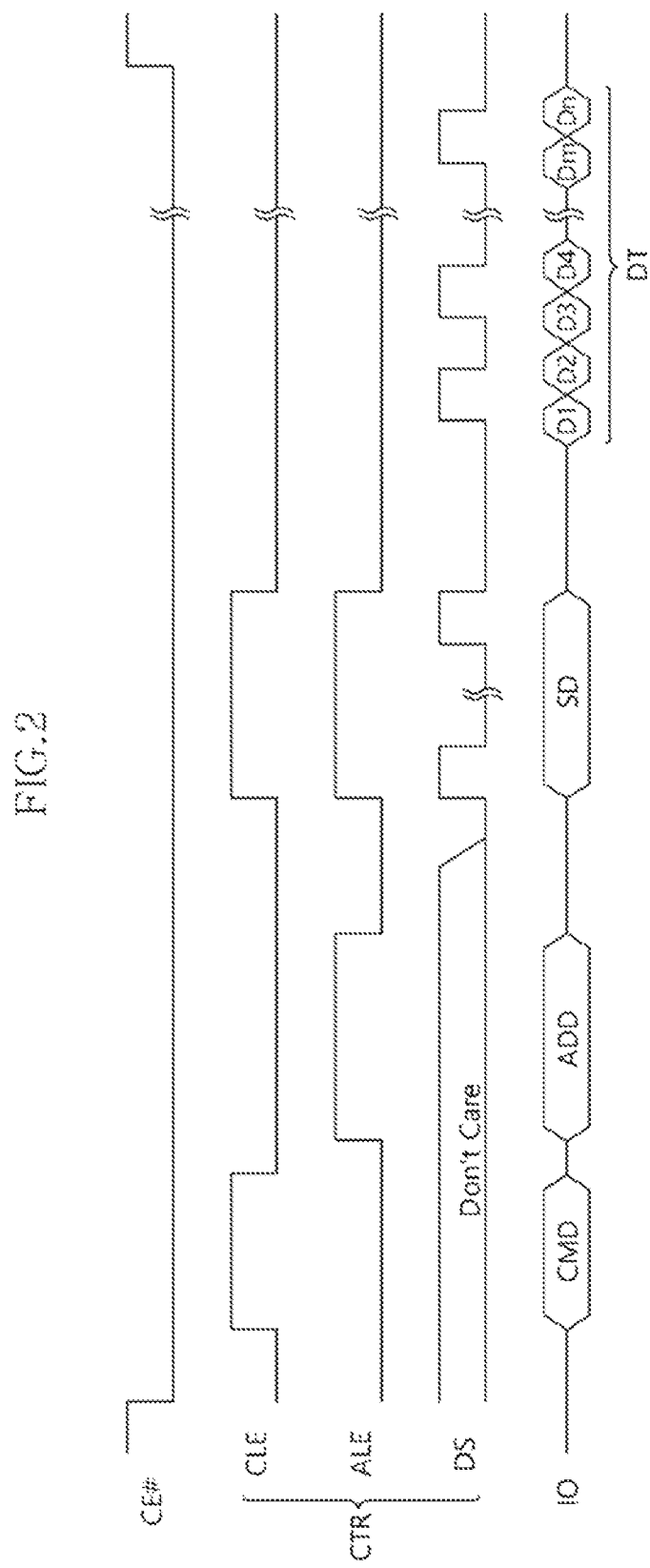
FIG. 2 is a timing diagram illustrating an input/output multiplexing scheme in accordance with an embodiment.

FIG. 2 is a timing diagram illustrating an input/output multiplexing scheme in accordance with an embodiment.

Figures 3, 4:
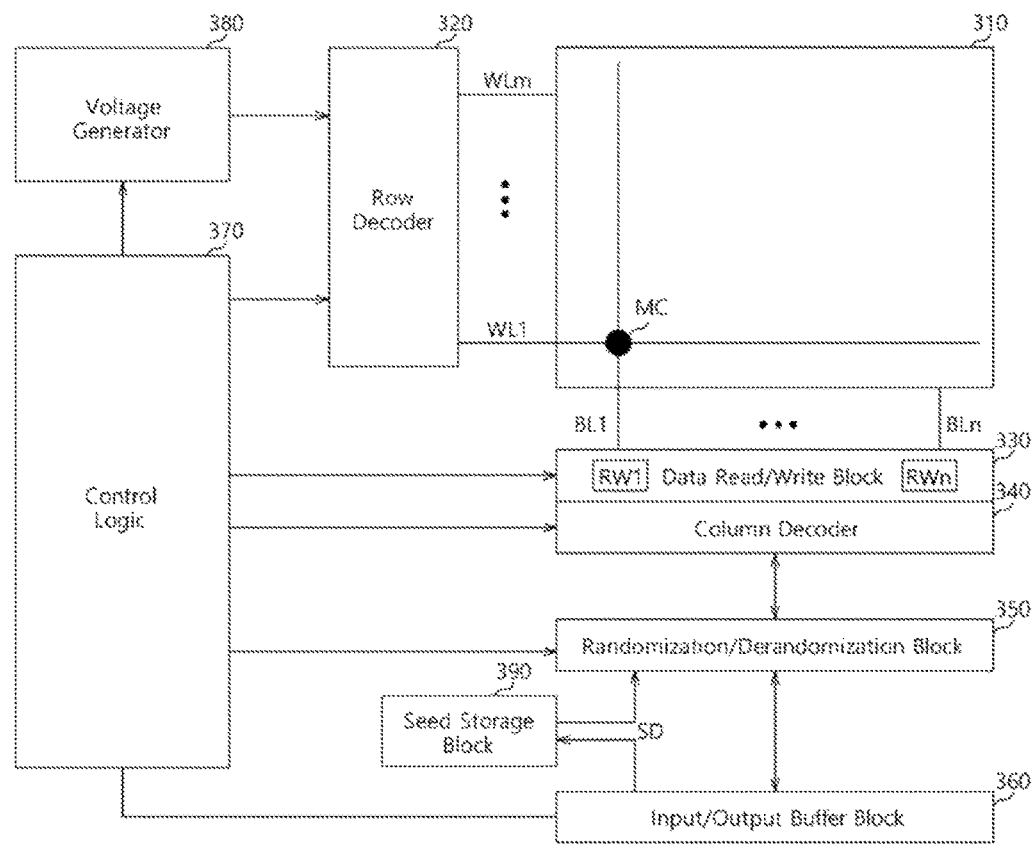
FIG. 3 is a table illustrating control signals used in the input/output multiplexing scheme shown in FIG. 2.
FIG. 4 is a block diagram illustrating a nonvolatile memory device in accordance with an embodiment.

FIG. 3 is a table illustrating exemplary control signals used in the input/output multiplexing scheme shown in FIG. 2.

Referring to FIG. 2, a signal suffixed with a symbol "#" may be enabled at logic low level and disabled at logic high level, which may be changed according to a design.

The nonvolatile memory device 300 may be enabled and perform an operation according to control of the controller 200, when the chip enable signal CE# is enabled at logic low level.

The nonvolatile memory device 300 may receive, as the control signals CTR, a command latch enable signal CLE, an address latch enable signal ALE and a data strobe signal DS from the controller 200. These control signals CTR are to only explain the present embodiment, and may be changed according to the kind of the nonvolatile memory device 300.

The command latch enable signal CLE (that is, a first control signal CLE) may inform the nonvolatile memory device 300 of a command CMD as the input/output signal IO transmitted through the input/output lines IOL. The address latch enable signal ALE (that is, a second control signal ALE) may inform the nonvolatile memory device 300 of an address ADD as the input/output signal IO transmitted through the input/output lines IOL. The data strobe signal DS (that is, a third control signal DS) may inform the nonvolatile memory device 300 of seed data SD or data DT as the input/output signal IO transmitted through the input/output lines IOL.

The nonvolatile memory device 300 may recognize that the input/output signal IO provided from the controller 200 is a command CMD when the command latch enable signal CLE is enabled to a logic high level and the address latch enable signal ALE is disabled to a logic low level. In this case, the state of the data strobe signal DS (e.g., enabled or disabled) is not relevant and may be ignored.

The nonvolatile memory device 300 may recognize that the input/output signal IO provided from the controller 200 is an address ADD when the address latch enable signal ALE is enabled to a logic high level and the command latch enable signal CLE is disabled to a logic low level. In this case, the data strobe signal DS may also be ignored regardless of whether the data strobe signal DS is enabled or disabled.

The nonvolatile memory device 300 may recognize that the input/output signal IO provided from the controller 200 is a seed data SD when both of the command latch enable signal CLE and the address latch enable signal ALE are enabled to a logic high level and the data strobe signal DS toggles. The nonvolatile memory device 300 may receive one seed data SD each time the data strobe signal DS toggles. The seed data SD may be used for the data randomizing/de-randomizing operation of the nonvolatile memory device 300.

The nonvolatile memory device 300 may recognize that the input/output signal IO provided from the controller 200 is a data DT when both of the command latch enable signal CLE and the address latch enable signal ALE disabled to a logic low level and the data strobe signal DS toggles. The nonvolatile memory device 300 may receive one data DT each time the data strobe signal DS toggles.

According to the present embodiment, the controller 200 may provide the command CMD, the address ADD, the seed data SD and the data DT through the input/output lines IOL by combining the command latch enable signal CLE, the address latch enable signal ALE and the data strobe signal DS. Also, the nonvolatile memory device 300 may distinguish the command CMD, the address ADD, the seed data SD and the data DT from one another based on the combination of the command latch enable signal CLE, the address latch enable signal ALE and the data strobe signal DS even though signals of different kinds (i.e., the command CMD, the address ADD, the seed data SD and the data DT) are provided through the same input/output lines IOL.

Figure 5:
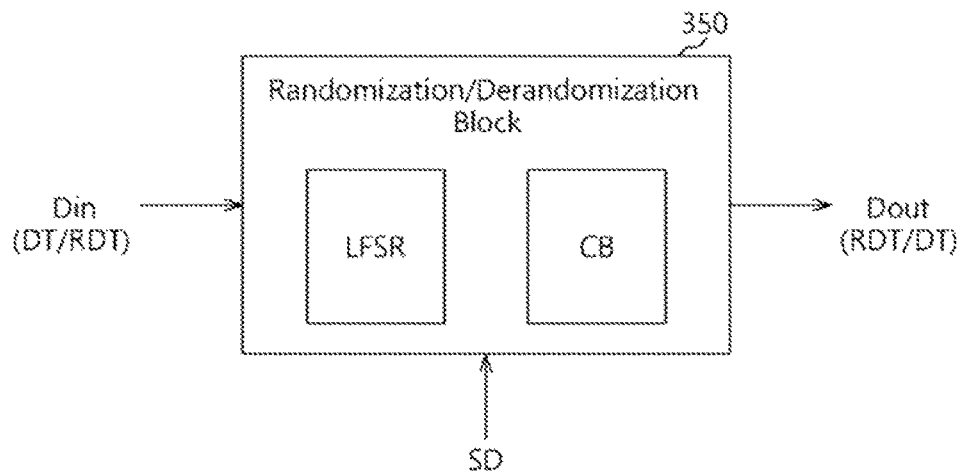
FIG. 5 is a block diagram illustrating a randomization/de-randomization block shown in FIG. 4.

FIG. 4 is a block diagram illustrating a nonvolatile memory device in accordance with an embodiment. FIG. 5 is a block diagram illustrating a randomization/de-randomization block 350 shown in FIG. 4.

Referring to FIG. 4, the nonvolatile memory device 300 may include a memory cell array 310, a row decoder 320, a data read/write block 330, a column decoder 340, a randomization/de-randomization block 350, an input/output buffer block 360, a control logic 370, a voltage generator 380, and a seed storage block 390.

The memory cell array 310 may include memory cells MC which are arranged at areas where word lines WL1 to WLm and bit lines BL1 to BLn intersect with each other.

The row decoder 320 may be coupled with the memory cell array 310 through a plurality of row lines including the word lines WL1 to WLm. The row decoder 320 may decode an address provided from the controller 200. The row decoder 320 may select and drive the word lines WL1 to WLm, based on a decoding result. For instance, the row decoder 320 may provide a first word line voltage provided from the voltage generator 380 to a selected word line and a second word line voltage provided from the voltage generator 380 to the remaining word lines.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 370. The data read/write block 330 may operate as a write driver or a sense amplifier according to an operation mode. For example, the data read/write block 330 may operate as a write driver which writes i.e., stores data in the memory cell array 310 in a program operation. For another example, the data read/write block 330 may operate as a sense amplifier which reads data from the memory cell array 310 in a read operation.

The column decoder 340 may operate according to control of the control logic 370. The column decoder 340 may decode an address provided from the controller 200. The column decoder 340 may select one or more of the read/write circuits RW1 to RWn of the data read/write block 330 based on a decoding result.

The randomization/de-randomization block 350 may operate according to control of the control logic 370. As shown in FIG. 5, the randomization/de-randomization block 350 may logically calculate input data Din and the seed data SD stored in the seed storage block 390, randomize or de-randomize the input data Din, and transfer the output data Dout. A randomizing operation and a de-randomizing operation may be opposite operations that use the same seed data SD.

For instance, the randomization/de-randomization block 350 may randomize data (that is, data to be programmed) DT which are provided from the input/output buffer block 360, and output the randomized data RDT. For another instance, the randomization/de-randomization block 350 may de-randomize data which are read by the data read/write block 330, that is, randomized data RDT, and output original data DT.

The randomization/de-randomization block 350 may include a linear feedback shift register LFSR which generates a random pattern based on the seed data SD stored in the seed storage block 390. Also, the randomization/de-randomization block 350 may include a calculation block CB which logically calculates the generated random pattern and the input data Din.

The input/output buffer block 360 may provide the input/output signals IO transmitted through the input/output lines IOL according to the combination of the control signals CTR, to internal blocks, as described above with reference to FIGS. 2 and 3. For example, the input/output buffer block 360 may be inputted with the command CMD and the address ADD from the controller 200, and provide the inputted command CMD and address ADD to the control logic 370. The input/output buffer block 360 may be inputted with the data DT from the controller 200, and provide the inputted data DT to the randomization/de-randomization block 350. The input/output buffer block 360 may be inputted with the seed data SD from the controller 200, and provide the inputted seed data SD to the seed storage block 390. The input/output buffer block 360 may output the de-randomized data provided from the randomization/de-randomization block 350, that is, data recovered to original data, to the controller 200.

The control logic 370 may control general operations of the nonvolatile memory device 300, based on the control signals provided from the controller 200. That is to say, the control logic 370 may control the internal blocks to perform operations such as read, program and erase operations, for the memory cells of the memory cell array 310, based on the command CMD and the address ADD provided from the input/output buffer block 360.

The voltage generator 380 may generate voltages to be used in internal operations of the nonvolatile memory device 300. The voltages generated by the voltage generator 380 may be applied to the memory cell array 310, the row decoder 320 and the data read/write block 330.

The seed storage block 390 may store the seed data SD provided from the input/output buffer block 360. The seed data SD stored in the seed storage block 390 may be used in the randomizing/de-randomizing operation of the randomization/de-randomization block 350.

Figure 6:
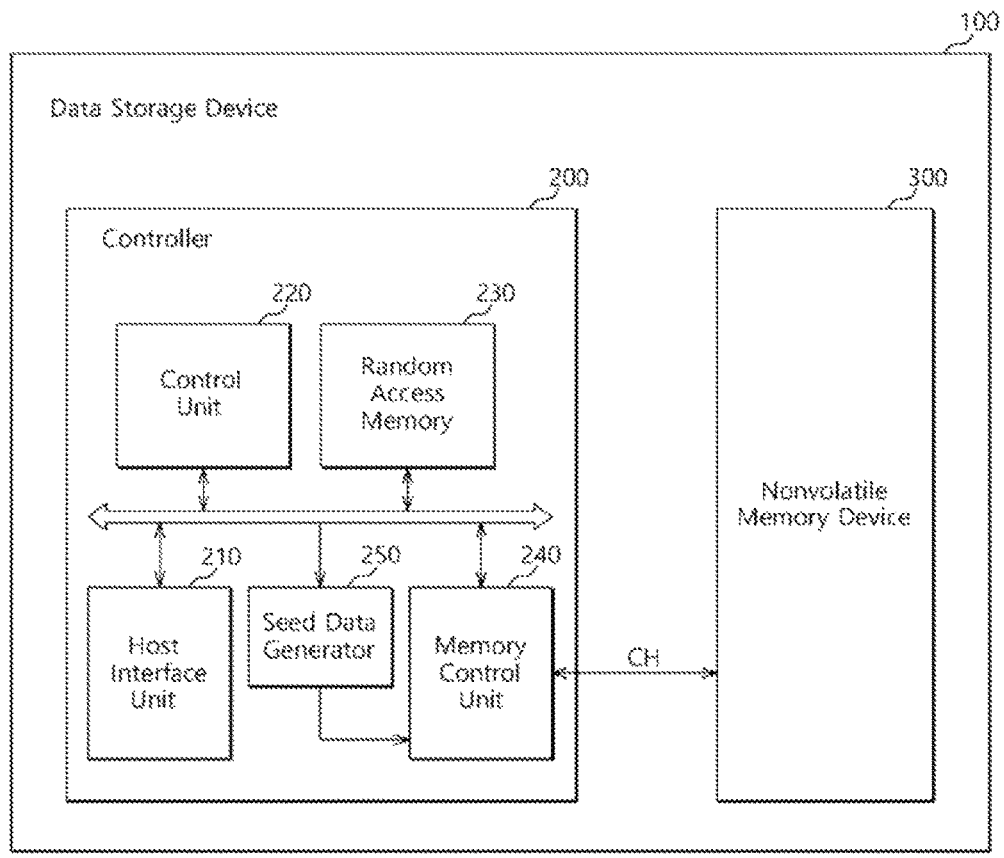
FIG. 6 is a block diagram illustrating a data storage device in accordance with an embodiment.

FIG. 6 is a block diagram illustrating a data storage device in accordance with an embodiment.

A data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be configured as any one of various kinds of storage devices according to the protocol of an interface which is electrically coupled with the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200 and a nonvolatile memory device 300.

The controller 200 may include a host interface unit 210, a control unit 220, a random access memory 230, a memory control unit 240, and a seed data generator 250.

The host interface unit 210 may interface the host device and the data storage device 100. For example, the host interface unit 210 may communicate with the host device by using a host interface, that is, any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The control unit 220 may control general operations of the controller 200. The control unit 220 may drive an instruction or an algorithm of a code type, that is, a software, loaded in the random access memory 230, and may control operations of function blocks in the controller 200. The control unit 220 may be configured by a micro control unit (MCU) or a central processing unit (CPU).

The random access memory 230 may store a software to be driven by the control unit 220. Further, the random access memory 230 may store data necessary for driving of the software. That is to say, the random access memory 230 may be used as the working memory of the control unit 220. The random access memory 230 may store data to be stored in the nonvolatile memory device 300 or data read out from the nonvolatile memory device 300. In other words, the random access memory 230 may be used as a data buffer memory or a data cache memory. The random access memory 230 may be configured by a random access memory such as a dynamic random access memory (DRAM) or a static random access memory (SRAM).

The memory control unit 240 may control the nonvolatile memory device 300 according to control of the control unit 220. The memory control unit 240 may also be referred to as a memory interface unit. The memory control unit 240 may provide control signals to the nonvolatile memory device 300. The control signals may include a command, an address, a control signal and so forth for controlling the nonvolatile memory device 300. The memory control unit 240 may provide data to the nonvolatile memory device 300 or may be provided with the data read out from the nonvolatile memory device 300.

The seed data generator 250 may generate seed data. The seed data may be provided to the nonvolatile memory device 300 to be used in the randomizing operation of the nonvolatile memory device 300. As aforementioned, the seed data may be generated by combining a command latch enable signal, an address latch enable signal and a data strobe signal, and may be provided in an input/output multiplexing scheme.

The nonvolatile memory device 300 may be coupled with the controller 200 through a channel CH which may include at least one signal line capable of transmitting a command, an address, control signals and data. The nonvolatile memory device 300 may be used as the storage medium of the data storage device 100. In an embodiment, the nonvolatile memory device 300 may be configured by a NAND flash memory device.

As described above, the nonvolatile memory device 300 may recognize according to a combination of a command latch enable signal, an address latch enable signal and a data strobe signal, that the input/output signals received through the input/output lines are one of a command, an address, seed data and data.

Figure 7:
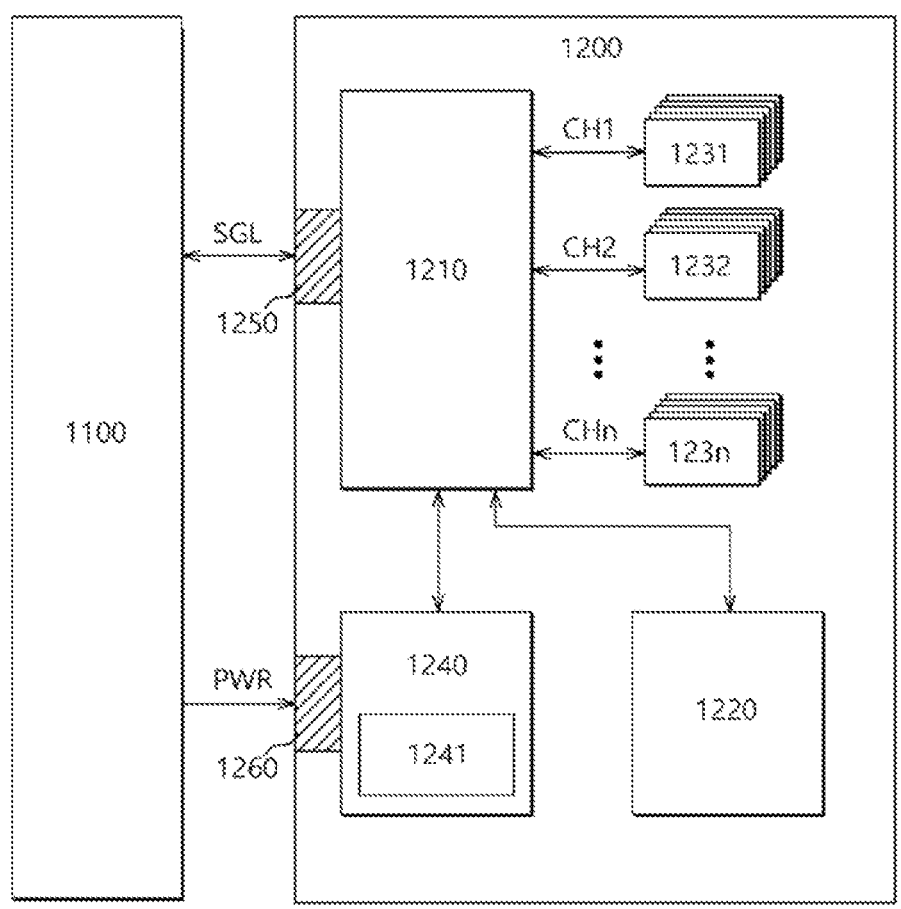
FIG. 7 is a diagram illustrating a data processing system including a solid state drive (SSD) in accordance with an embodiment.

FIG. 7 is a diagram illustrating a data processing system including a solid state drive (SSD) in accordance with an embodiment. Referring to FIG. 7, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200.

The buffer memory device 1220 may temporarily store data to be stored in the nonvolatile memory devices 1231 to 123n. Further, the buffer memory device 1220 may temporarily store data read from the nonvolatile memory devices 1231 to 123n. The data which are temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to each channel. In an embodiment, the nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacitance capacitors capable of charging power PWR.

The controller 1210 may exchange a signal SGL with the host device 1100 through the signal connector 1250. The signal SGL may include a command, an address, data, and so forth. The signal connector 1250 may be constructed by various types of connectors depending on an interface scheme between the host device 1100 and the SSD 1200.

Figure 8:
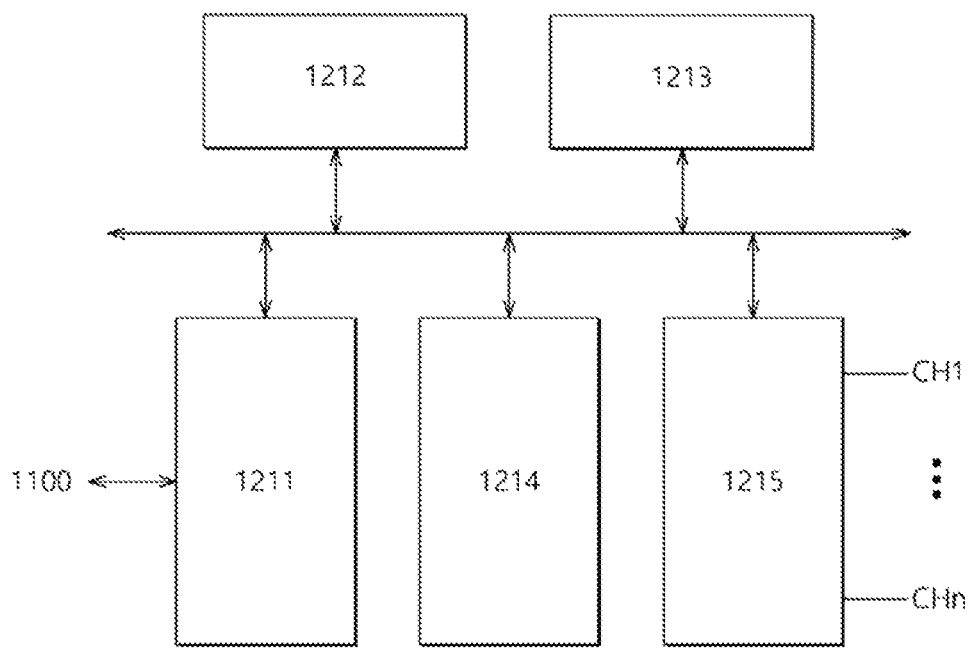
FIG. 8 is a diagram illustrating a controller shown in FIG. 7.

FIG. 8 is a diagram illustrating the controller shown in FIG. 7. Referring to FIG. 8, the controller 1210 may include a host interface unit 1211, a control unit 1212, a random access memory 1213, an error correction code (ECC) unit 1214, and a memory interface unit 1215.

The host interface unit 1211 may interface the host device 1100 and the SSD 1200 according to the protocol of the host device 1100. For example, the host interface unit 1211 may communicate with the host device 1100 through any one of secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS) protocols. In addition, the host interface unit 1211 may perform a disk emulating function for supporting the host device 1100 to recognize the SSD 1200 as a general purpose data storage device, for example, a hard disk drive (HDD).

The control unit 1212 may analyze and process the signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

Figure 9:
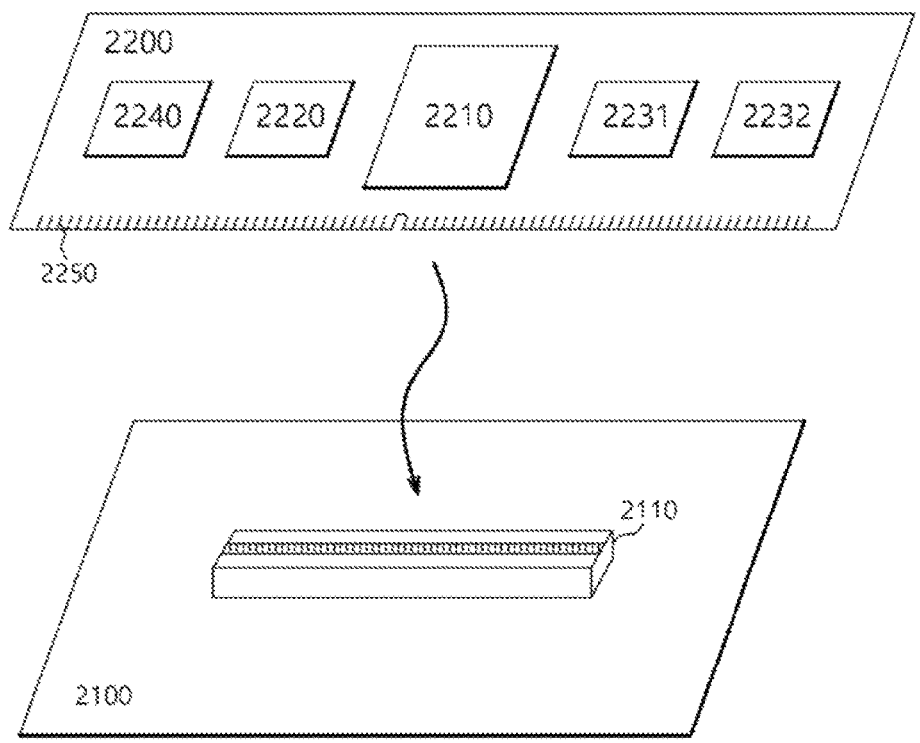
FIG. 9 is a diagram illustrating a data processing system in including a data storage device in accordance with an embodiment.

FIG. 9 is a diagram illustrating a data processing system including a data storage device in accordance with an embodiment. Referring to FIG. 9, a data processing system 2000 may include a host device 2100 and a data storage device 2200.

The host device 2100 may be constructed in the form of a board such as a printed circuit board. Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be constructed in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 7.

The buffer memory device 2220 may temporarily store data to be stored in the nonvolatile memory devices 2231 and 2232. Further, the buffer memory device 2220 may temporarily store the data read out from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be constructed into various types depending on an interface scheme between the host device 2100 and the data storage device 2200. The connection terminal 2250 may be disposed on any one side of the data storage device 2200.

Figure 10:
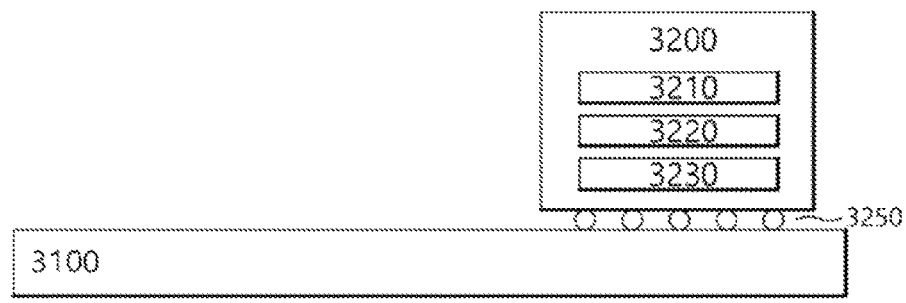
FIG. 10 is a diagram illustrating a data processing system including a data storage device in accordance with an embodiment.

FIG. 10 is a diagram illustrating a data processing system including a data storage device in accordance with an embodiment. Referring to FIG. 10, a data processing system 3000 may include a host device 3100 and a data storage device 3200.

The host device 3100 may be constructed in the form of a board such as a printed circuit board. Although not shown, the host device 3100 may include internal function blocks for performing the function of a host device.

The data storage device 3200 may be constructed in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 7.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 11:
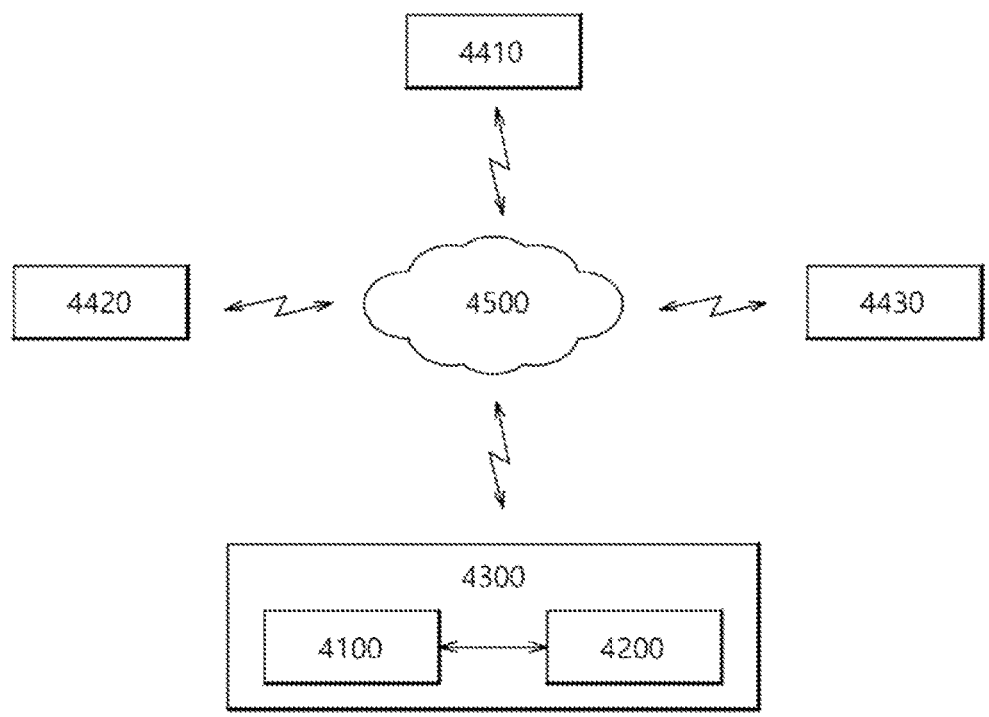
FIG. 11 is a diagram illustrating a network system including a data storage device in accordance with an embodiment.

FIG. 11 is a diagram illustrating a network system including a data storage device in accordance with an embodiment. Referring to FIG. 11, a network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be configured by the data storage device 100 shown in FIG. 6, the data storage device 1200 shown in FIG. 7, the data storage device 2200 shown in FIG. 9 or the data storage device 3200 shown in FIG. 10.

While various embodiments have been described above, it will be understood to those skilled in the art that the embodiments described are examples only. Accordingly, the operating methods of a nonvolatile memory device and a data storage device including the same described herein should not be limited based on the described embodiments.

What is claimed is:

1. A method for operating a data storage device including a nonvolatile memory device and a controller, the method comprising:
   generating, by the controller, seed data and transmitting to the nonvolatile memory device one of a command, an address, the seed data and data via a input/output line and first, second and third control signals via corresponding signal lines; and
   receiving, by the nonvolatile memory device, any one of the transmitted command, the address, the seed data and the data depending on at least two of the first, second and third control signals,
   wherein the nonvolatile memory device randomizes or de-randomizes the data based on the seed data transmitted from the controller.

2. The method according to claim 1, wherein the nonvolatile memory device receives the seed data when the first control signal and the second control signal are enabled and the third control signal toggles.

3. The method according to claim 1, wherein the nonvolatile memory device receives the command when the first control signal is enabled and the second control signal is disabled.

4. The method according to claim 1, wherein the nonvolatile memory device receives the address when the first control signal is disabled and the second control signal is enabled.

5. The method according to claim 1, wherein the nonvolatile memory device receives the data when the first control signal and the second control signal are disabled and the third control signal toggles.

6. The method according to claim 1, wherein the first control signal is a command latch enable signal, the second control signal is an address latch enable signal, and the third control signal is a data strobe signal.

7. A method for operating a nonvolatile memory device, comprising:
   receiving input/output signals including a command, an address, seed data and data through input/output lines from a controller;
   receiving a first control signal and a second control signal;
   identifying the input/output signal as the seed data when the first control signal and the second control signal are enabled; and
   randomizing or de-randomizing the data based on the seed data received from the controller.

8. The method according to claim 7,
   further comprising receiving a third control signal,
   wherein the receiving of the input/output signals includes receiving the seed data each time the third control signal toggles.

9. The method according to claim 8, wherein the first control signal is a command latch enable signal, the second control signal is an address latch enable signal, and the third control signal is a data strobe signal.

10. The method according to claim 7, further comprising identifying the input/output signal as the command when the first control signal is enabled and the second control signal is disabled.

11. The method according to claim 7, further comprising identifying the input/output signal as the address when the first control signal is disabled and the second control signal is enabled.

12. The method according to claim 7, further comprising identifying the input/output signal as the data when the first control signal and the second control signal are disabled.

13. The method according to claim 12,
    further comprising receiving a third control signal,
    wherein the receiving of the input/output signals includes receiving the data each time the third control signal toggles.

14. A nonvolatile memory device comprising:
    an input/output buffer block suitable for receiving input/output signals including one or more of a command, an address, data and seed data based on a combination of first to third control signals from a controller;
    a seed storage block suitable for storing the seed data when the first and second control signals are enabled; and
    a randomization/de-randomization block suitable for randomizing the data to be stored in memory cells or de-randomizing the data read out from the memory cells based on the seed data received from the controller.

15. The nonvolatile memory device according to claim 14, wherein the input/output buffer block receives the seed data each time the third control signal toggles.

16. The nonvolatile memory device according to claim 14, wherein the input/output buffer block receives the command when the first control signal is enabled and the second control signal is disabled.

17. The nonvolatile memory device according to claim 14, wherein the input/output buffer block receives the address when the first control signal is disabled and the second control signal is enabled.

18. The nonvolatile memory device according to claim 14, wherein the input/output buffer block receives one data each time the third control signal toggles when the first control signal and the second control signal are disabled.

* * * * *